(12) United States Patent
Arbouet et al.

(10) Patent No.: US 9,263,229 B2
(45) Date of Patent: Feb. 16, 2016

(54) DEVICE AND METHOD FOR ELECTRON EMISSION AND DEVICE INCLUDING SUCH AN ELECTRON EMISSION SYSTEM

(71) Applicants: Arnaud Arbouet, Toulouse (FR); Florent Houdellier, Toulouse (FR)

(72) Inventors: Arnaud Arbouet, Toulouse (FR); Florent Houdellier, Toulouse (FR)

(73) Assignee: CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 0 days.

(21) Appl. No.: 14/378,386

(22) PCT Filed: Feb. 15, 2013

(86) PCT No.: PCT/EP2013/053127
§ 371 (c)(1),
(2) Date: Aug. 13, 2014

(87) PCT Pub. No.: WO2013/121021
PCT Pub. Date: Aug. 22, 2013

(65) Prior Publication Data
US 2015/0008323 A1    Jan. 8, 2015

(30) Foreign Application Priority Data

Feb. 16, 2012  (FR) ..................................... 12 51450

(51) Int. Cl.
*G21K 5/04* (2006.01)
*H01J 37/073* (2006.01)
*H01J 37/26* (2006.01)
*H01J 37/285* (2006.01)

(52) U.S. Cl.
CPC .............. *H01J 37/073* (2013.01); *H01J 37/26* (2013.01); *H01J 37/285* (2013.01); *H01J 2237/022* (2013.01); *H01J 2237/049* (2013.01); *H01J 2237/0432* (2013.01); *H01J 2237/06333* (2013.01); *H01J 2237/06341* (2013.01); *H01J 2237/21* (2013.01); *H01J 2237/2614* (2013.01); *H01J 2237/2626* (2013.01); *H01J 2237/2802* (2013.01)

(58) Field of Classification Search
USPC ...................... 250/423 R, 424, 423 P, 423 F; 315/111.01, 111.81, 111.91
See application file for complete search history.

(56) References Cited

U.S. PATENT DOCUMENTS 5,041,724 A * 8/1991 Feuerbaum et al. .......... 250/307
2002/0195570 A1 * 12/2002 Howard ................ H01J 37/075
250/427

* cited by examiner

*Primary Examiner* — Nicole Ippolito
(74) *Attorney, Agent, or Firm* — Young & Thompson

(57) ABSTRACT

A device and method for emitting electrons by a field effect. The device (10) includes a vacuum chamber (12) including a tip (14) having an end (18) and forming a cold cathode, an extracting anode (16), components adapted for generating a potential difference between the tip (14) and the anode (16);
- an electromagnetic wave source (22) outside the chamber (12);
- a system (24) for forwarding the electromagnetic wave emitted by the electromagnetic wave source from the outside to the inside of the chamber as far as the vicinity of the tip (14);
- a system (26) for focusing the electromagnetic wave, laid out inside the chamber (12); and
- a system (28) for aligning the electromagnetic wave outside the chamber and adapted for allowing alignment of the electromagnetic wave focused by the focusing system on the end of the tip.

14 Claims, 4 Drawing Sheets

DEVICE AND METHOD FOR ELECTRON EMISSION AND DEVICE INCLUDING SUCH AN ELECTRON EMISSION SYSTEM

The present invention relates to a device for emitting electrons and to the corresponding method, to a system including such an emission device, such as an electron microscope and to the use of such a device or such a method for electron emission.

In particular, the present invention applies to the field of accelerated high voltage electron sources notably intended for transmission or scanning electron microscopy.

In a known way, the principle of transmission electron microscopy is to use an electron beam instead of the light beam used in optical microscopy. The wavelength associated with the electron beam gives the possibility of obtaining a much higher resolution in electron microscopy than that obtained in optical microscopy.

However, constraints are related to the use of electrons. Notably, a high vacuum should be available inside the electron microscope.

Further and in order to carry out transmission electron microscopy, the samples used have to be ultra thin so as to be as transparent as possible to the electrons. An electron beam is then focused on the sample to be observed via electromagnetic lenses.

In the case of transmission electron microscopy, only the electrons crossing the sample are analyzed. Three kinds of electrons are then distinguished: the transmitted electrons which have not reacted with the sample, the scattered electrons without any loss of energy following interaction with the atoms of the sample and the scattered electrons with an energy loss following interaction of the incident electrons with the electron processions of the atoms of the sample. By using the transmitted electron beams and the scattered electron beams, it is possible to generate the contrast of images obtained in transmission electron microscopy, noted as TEM.

There are two main families of electron guns: hot cathode electron guns and cold cathode electron guns.

In this second family of electron guns, so-called «cold cathode electron guns» and also called «cold field emission guns» (and sometimes simply «field emission guns» erroneously), electrons are dislodged by a tunnel effect from a fine metal tip, generally in tungsten, said metal tip being subject to a high electric field of the order of GV/m. The metal tip is not heated, no electric current flows through said tip and the latter is for example connected to the floating ground of the high-voltage; the result of this is that the tip is substantially maintained at room temperature. The thereby dislodged electrons are then accelerated by an acceleration voltage applied between the cathode and an anode, the acceleration voltage being of the order of 100 kV. In high resolution electron microscopes, this acceleration voltage sometimes attains 300 kV. Similarly, by «cold cathode», is meant the end of the tip forming the cathode of such a device.

Generally, such a cold cathode source of electrons, wherein the electrons are dislodged by a tunnel effect, has low energy dispersion. Further, such a cold field emission source is quasi point-like. It then has much higher brightness and spatial coherence than hot cathode sources.

However, these cold cathode sources require an extremely high vacuum. Without the presence of this vacuum, the tip of the gun oxidizes and the emission effect is attenuated.

There also exist variants of electron guns, for example thermally assisted field emission guns as well as field effect guns, so-called Schottky guns using tungsten cathodes with a zirconia tank. The latter type of guns remains a good compromise between thermo-ionic incoherent sources and cold field emission coherent sources but does not have all the advantages of cold cathode electron guns.

Documents DE 196 04 272 A1 and US 2004/0124365 A1 discloses embodiments of thermally assisted field emission guns or field effect guns, so-called Schottky guns. A photon beam assists with the emission of electrons. In these devices, the metal tip is heated, and a significant portion of the emitted electrons results from this thermal effect. These devices therefore do not form cold cathode electron guns. It is also noted that with such devices, it is not possible to obtain a source of electrons with a brightness as great as and spatial coherence as good as those obtained with a cold cathode electron gun.

In the field of electronic holography, and notably dark field holography, performances notably in terms of brightness and coherence are required. Cold field emission electron sources are the best suited for this.

Up to now, different strategies were used for studying dynamic processes by electron microscopy. According to the timescale of the investigated process, traditionally two approaches are distinguished: electron microscopy in situ and dynamic electron microscopy.

Based on interfacing the electron microscope with a video camera, microscopy in situ gives the possibility of obtaining images with an exposure time and intervals between successive images of the order of the millisecond.

Now, many processes in physics, materials science, chemistry and biology have characteristic times incompatible with video acquisition rates.

Dynamic transmission electron microscopy techniques (DTEM according to the acronym for "Dynamic Transmission Electron Microscope"), specifically dedicated to the study of these ultra fast phenomena have undergone several development stages since the 1970s. At the beginning of the 1980s, the ultra-fast electron diffraction technique was developed which uses a source of electrons consisting of a photocathode coupled with a pulsed laser. The principle of a pulsed photocathode is to admit ultra short electron pulses by a photo-electric effect, the electromagnetic wave providing the electrons with energy at least equal to the work function of the material forming the photocathode. At the end of the 1980s, the implementation of a pulsed photocathode in a transmission electron microscope was demonstrated. These developments resulted in instruments having a time resolution of the order of one nanosecond and a spatial resolution of the order of about hundred nanometers.

In dynamic electron microscopy, two distinct acquisition modes are distinguished: single-shot mode or stroboscopic mode.

In the «single-shot» approach, a TEM observation, synchronized with an excitation of the sample, is performed by means of a single packet of electrons. The large number of electrons required for producing an image and the space charge and Coulomb repulsion effects presently limits spatial resolution in this operating mode.

The stroboscopic approach consists of observing an object which periodically moves over time, at a specific instant within each period. This second DTEM approach has been recently improved by A. Zewail et al. (*Four Dimensional Electron Tomography, Science*, 2010, 328, 187-193) in the light of ultra fast optical spectroscopy experiments in femtochemistry. Thus, the object to be studied is cyclically excited by ultra short laser pulses so-called «pumping» pulses taken from the train of pulses from a high repetition rate femtosecond laser (MHz-GHz). The other portion of this pulse train is focused on the photocathode in order to trigger the emission of ultra short «probe» electron packets which will allow observation of a sample by TEM (imaging, electron diffraction or energy loss). Each of the electron pulses only contains a small number of electrons at the investigated sample (1-1000) and a large number of pulses are therefore integrated on the detector so as to obtain a satisfactory signal-to-noise ratio. By controlling the time interval between pumping and probe pulses by means of a delay line, it is possible to investigate the object at different instants of its cycle. This solution and based on a triggering of electron emission by means of intense femtosecond laser pulses focused on a photocathode gives the possibility today of obtaining sub-picosecond time resolution in the DTEM.

However, the intrinsic defects of pulsed photocathodes, such as low space and time coherence and highly reduced brightness, limit spatial and energy resolutions which may be obtained by using them in a TEM. Further, these limitations categorically prevent their use for electron interferometry or coherent electron diffraction experiments.

The object the present invention is to provide an electron emission device at least partly overcoming the aforementioned drawbacks.

More particularly, the invention is aimed at providing a suitable electron emission device for emitting electron pulses with subpicosecond duration and accelerated at a very high voltage notably for the fields of electron microscopy and interferometry.

For this purpose and according to a first aspect, the invention proposes a field effect electron emission device comprising:
  a vacuum chamber including a tip comprising an end and forming a cold cathode, an extracting anode, suitable components for generating a potential difference between the tip and the anode;
  and electromagnetic wave source outside the chamber;
  a system for forwarding the electromagnetic wave emitted by the electromagnetic wave source from the inside of the chamber as far as the vicinity of the tip;
  a system for focusing the electromagnetic wave, laid out inside the chamber; and
  a system for aligning the electromagnetic wave laid out outside the chamber and suitable for allowing alignment of the electromagnetic wave focused by the focusing system on the end of the tip.

Such an electron emission device belongs to the family of cold cathode electron gun devices, i.e. where the electrons are dislodged by a tunnel effect, and gives the possibility of ensuring ultra fast pulsed field effect electron emission.

According to preferred embodiments, the electron emission device according to the invention comprises one or several of the following features, taken separately or as a combination:
  the assembly formed by the electromagnetic wave source, the forwarding system, the focusing system and the alignment system is suitable for propagating the electromagnetic wave so that it arrives at the end of the tip with an angle different from 0° or 180° relatively to the axis of the cathode;
  the assembly formed by the electromagnetic wave source, the forwarding system, the focusing system and the alignment system is suitable for propagating the electromagnetic wave so that it arrives at the end of the tip with an angle comprised between 45° and 135° relatively to the axis of the cathode;
  the assembly formed by the electromagnetic wave source, the forwarding system, the focusing system and the alignment system is suitable for propagating the electromagnetic wave so that it arrives at the end of the tip substantially perpendicularly to the axis of the cathode;
  the forwarding system comprises an entry window suitable for transmitting the electromagnetic wave from the outside to the inside of the chamber and a hollow tube suitable for propagating the electromagnetic wave in the chamber as far as the vicinity of the end of the tip, the tube being in a material having a dielectric coefficient substantially comprised between 10 and 40 kV/mm;
  the entry window is in ceramic, transparent to the wavelengths of the electromagnetic wave emitted by the source;
  the system for focusing the electromagnetic wave comprises a plane mirror and a parabolic or spherical mirror positioned on either side of the tip, each mirror being connected to the same electric potential as the tip;
  the alignment system comprises two scanning mirrors and an optical system for example a telescopic or telecentric system;
  the alignment system is suitable for producing a scanning of the focused electromagnetic wave by at least 0.5 mm in each of the three dimensions around the tip;
  the tip is selected from the list consisting in:
    a tungsten tip oriented along different crystallographic axes;
    a cone-shaped tip in a material including carbon;
    a gold tip;
  the electromagnetic wave source is a laser and notably a femtosecond laser; and
  the electromagnetic wave emitted by the electromagnetic wave source has a wavelength comprised between 0.1 µm and 8 µm.

According to a second aspect, the invention also relates to a system comprising at least one electron emission device as described earlier, the system being selected from the list consisting in:
  a transmission or scanning electron microscope,
  an ultra fast electron diffraction device,
  an electron lithography system.

Moreover, according to a third aspect, the invention relates to an electron microscope including an electron emission device as described earlier, a column including electronic optical components and means for accelerating electrons emitted by the electron emission device.

According to preferred embodiments, the means for accelerating electrons are adapted so as to generate an acceleration voltage comprised between a few kV and a few MV.

Further, according to a fourth aspect, the invention relates to a method for admitting electrons by a field effect comprising the following steps:
  providing an electron emission device as described earlier,
  emitting an electromagnetic wave on the outside of the chamber with the electromagnetic wave source of the electron emission device;
  propagating the electromagnetic wave emitted towards the inside of the chamber as far as the vicinity of the tip;
  focusing the electromagnetic wave inside the chamber onto the tip; and
  aligning the electromagnetic wave focused on the tip, the alignment step being carried out from the outside of the chamber.

Moreover, according to a fifth aspect, the invention proposes a use of the electron emission device or of the electron emission method as described earlier, for emitting electrons in a controlled way with the electromagnetic wave source.

Other features and advantages of the invention will become apparent upon reading the description which follows of a preferred embodiment of the invention, given as an example and with reference to the appended drawings.

In the different figures, similar elements are designated with identical references. Further, the different elements are not necessarily illustrated to scale in order to show a view facilitating the understanding of the invention.

Figure 1:
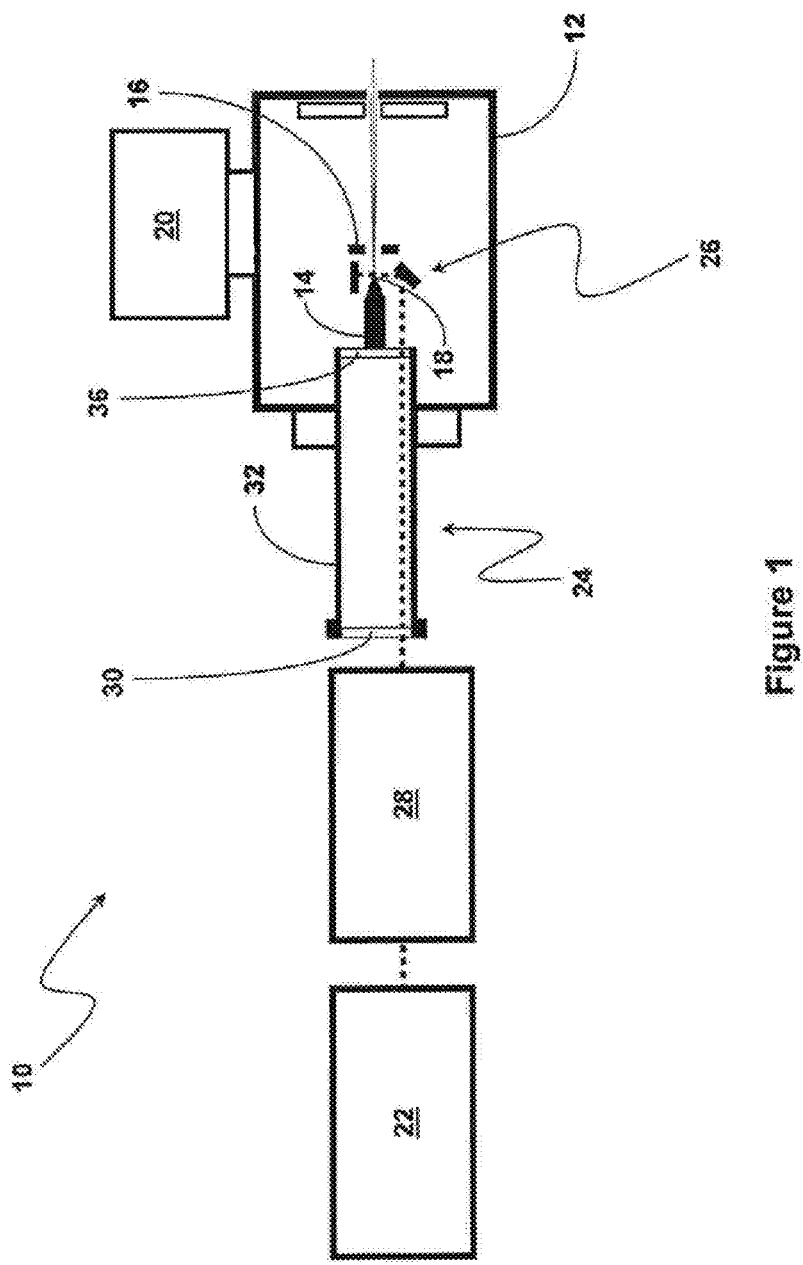
FIG. 1 illustrates a block diagram of an electron emission device according to the invention.

FIG. 1 illustrates a cold field effect electron emission device 10 according to the invention. The electron emission device 10 comprises a vacuum chamber 12 including a tip 14 and an extracting anode 16.

The extracting anode 16 is for example a positively biased metal plate.

The tip 14, which forms a cold cathode, comprises an end 18 is called an apex. It is metallic and prepared with a very fine tip shape.

For example, the tip 14 is a tungsten tip oriented along different crystallographic axes, a cone-shaped tip in a material including carbon, a gold tip.

The radius of curvature of the apex of the tip forming a cold cathode is preferably less than or equal to 50 nm allowing a sufficient electric field to be obtained by a tip effect.

The cold field effect electron emission device 10 implies that the tip 14 is not heated when the latter is operating.

In a known way, the apex of the cathode is placed at an optimized distance comprised between 1 and 15 mm from the extracting electrode 16.

Further, the electron emission device 10 includes a pumping system 20 connected to the chamber 12 and suitable for generating a vacuum inside the chamber, for example an ultrahigh vacuum, the pressure of which is substantially equal to $10^{-9}$ Pa. of course, the chamber 12 is a suitable material for supporting such a vacuum.

For example, the pumping system 20 includes one or several ion pumps and/or one or several entrapment pumps located close to the cathode 14. In a known way, an entrapment pump commonly called an NEG pump (according to the acronym for "Non Evaporate Getter") includes so-called "getter" non-evaporable materials for improving dynamic pumping when in the particular case described here, the electron emission device is operating.

Further, the electron emission device 10 further includes components not shown in FIG. 1, suitable for generating an electric potential difference between the tip 14 and the extracting anode 16.

Further, the electron emission device 10 may include a system for cleaning the cathode suitable for generating and causing the flow of a low current in the tip 14, commonly called a "Flash". Such a cleaning system notably allows reduction in the contamination of the cathode.

Further, the electron emission device 10 may include a system for cleaning the extracting anode 16, for a sample system for degassing the extracting anode, placed in the vicinity of the tip during the complete ovening of the electron emission device 10. For example, the degassing system includes heating resistors, halogen lamps or even tungsten filaments which emit significant doses of electrons towards the face of the extracting anode facing the tip.

The electron emission device 10 further comprises an electromagnetic wave source 22 outside the chamber 12. The electromagnetic wave source 22 is ultra fast, i.e. suitable for generating ultra short electromagnetic wave pulses, the duration of which is substantially less than 1 ps.

Preferably, the electromagnetic wave emitted by the electromagnetic wave source 22 has a wavelength comprised between 0.1 µm and 8 µm.

For example, the electromagnetic wave source 22 is a laser and notably a femtosecond laser, such as a femtosecond laser for which the emission wavelength is comprised between the infrared and the ultraviolet.

Further, the electromagnetic wave source 22 includes a means for adjusting the polarization of the electromagnetic beam emitted by the source 22, this adjustment means being laid out outside the chamber 12.

The electron emission device 10 further includes a system 24 for forwarding the electromagnetic wave emitted by the electromagnetic wave source 22 from the outside towards the inside of the chamber 12 as far as the vicinity of the tip 14.

Preferably, the system 24 for forwarding the electromagnetic wave from the outside to the inside of the chamber is usable for forwarding the electromagnetic wave from the rear of the tip 14, i.e. on the opposite side to the extracting anode 16, as far as the vicinity of the apex 18 of the tip 14.

Such a forwarding system from the rear of the tip gives the possibility of not modifying the elements of a standard transmission electron microscope, located under the tip such as the extracting anode, the anode suitable for focusing the electrons, a so-called "gun-lens", the means for accelerating the emitted electrons, the column and the detectors and thus allowing its remarkable optical properties to be kept unchanged.

Further, the electron emission device 10 includes a system 26 for focusing the electromagnetic wave on the end 18 of the tip 14, laid out inside the chamber 12 and a system 28 for aligning the electromagnetic wave, laid out outside the chamber 12 and suitable for allowing alignment of the electromagnetic wave focused by the focusing system 26 on the end of 18 of the tip 14.

The assembly formed by the electromagnetic wave source 22, the forwarding system 24, the focusing system 26 and the alignment system 28 is suitable for propagating the electromagnetic wave so that it reaches the end 18 of the tip 14 perpendicularly to the axis of the cathode 14.

Such an assembly allows the polarization of the electromagnetic wave arriving on the tip to be parallel to the direction of electron emission, i.e. to the axis of the tip.

It should be noted that if this geometrical arrangement of said assembly corresponds to a particularly advantageous embodiment, it is possible to apply the present invention with a different geometrical arrangement of said assembly, wherein the assembly formed by the electromagnetic wave source 22, the forwarding system 24, the focusing system 26 and the alignment system 28 is suitable for propagating the electromagnetic wave so that it reaches at the end 18 of the tip with an angle different 0° or 180° relatively to the tip axis 14. In these cases, the polarization of the electromagnetic wave arriving on the tip is not perpendicular to the axis of the tip. The obtained effect is proportional to the square of the cosine of the angle between the polarization of the electromagnetic wave arriving on the tip and the axis of the tip. One skilled in the art may select a suitable angle depending on the sought effect. According to an embodiment, the assembly formed by the electromagnetic wave source 22, the forwarding system 24, the focusing system 26 and the alignment system 28 is suitable for propagating the electromagnetic wave so that it arrives at the end 18 of the tip with an angle comprised between 45° and 135° relatively to the axis of the tip 14.

For this purpose, the forwarding system, the focusing system and the alignment system will now be described in detail.

Figure 2:
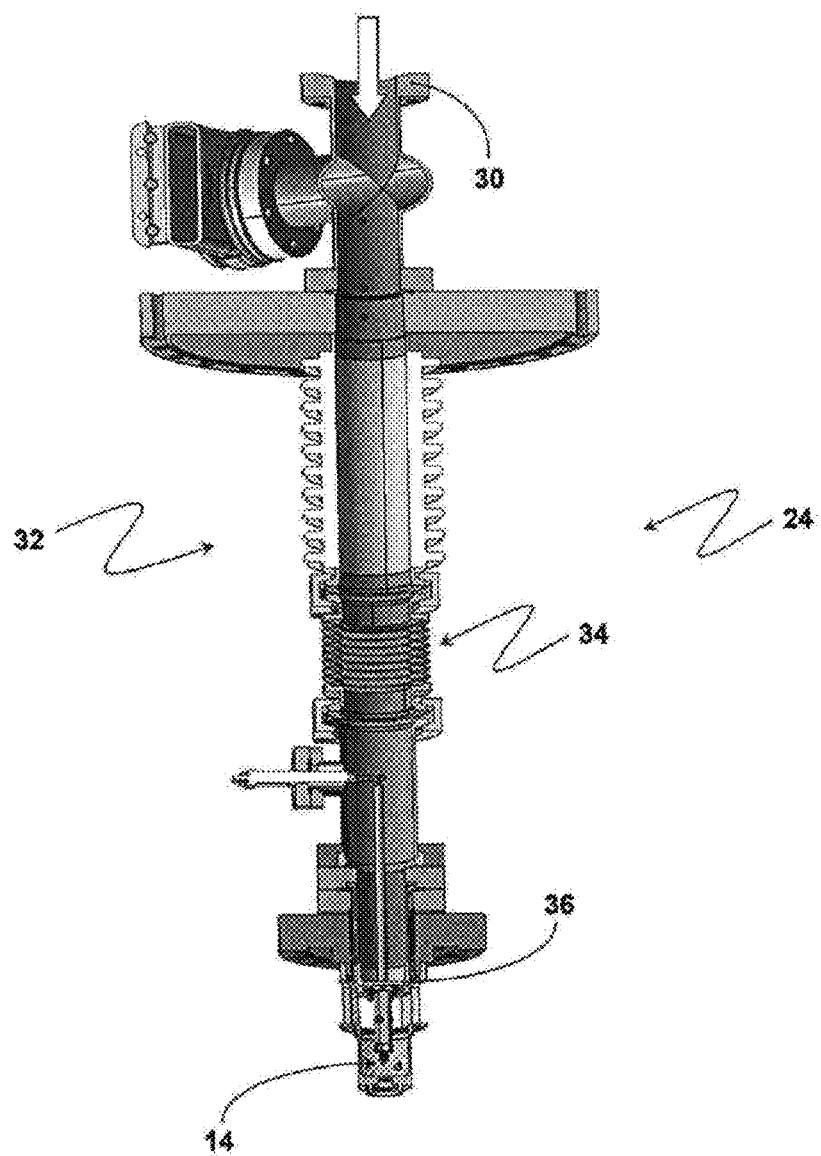
FIG. 2 is a perspective and sectional block diagram of an embodiment of a system for forwarding the electromagnetic wave of the electron emission device of FIG. 1.

FIG. 2 illustrates in a more detailed way an embodiment of a system 24 for forwarding the electromagnetic wave of the electron emission device of FIG. 1.

The forwarding system 24 comprises a first window 30, a hollow tube 32 and a second window 36, subsequently called an entry window 36. The hollow tube 32 is laid out between the first window 30 and the entry window 36.

The first window 30 is adapted for transmitting the electromagnetic wave emitted by the electromagnetic wave source 22 from the outside to the inside of the tube 32. It is in traditional glass transparent to the wavelengths of the electromagnetic wave emitted by the electromagnetic wave source 22.

The hollow tube 32 is adapted for propagating the electromagnetic wave in the chamber 12 as far as the vicinity of the end 18 of the tip 14.

Preferably, the hollow tube 32 is in a material having a dielectric coefficient substantially comprised between 10 and 40 kV/mm. Notably, the tube is in ultra pure alumina. Such a material selection allows electrical insulation of the elements of the emission device 10 located upstream from the hollow tube 32 and for which the potential is the ground potential, from the region around the tip 14, located downstream from the hollow tube 32, for which the average potential is floating at the high negative acceleration voltage (−HV). The terms of upstream and downstream are meant relatively to the direction of propagation of the electromagnetic wave emitted by the electromagnetic wave source 22 as far as the tip 14.

Further, the material as well as the shape of the tube is suitably selected so as to minimize the length of the tube. For example, for a source operating at 200 kV, an ultra pure cut alumina ceramic tube with leakage lines adapted for increasing the insulating area surface area without increasing the length, advantageously allows a reduction in the length of the tube to 10 cm for minimized bulkiness.

The forwarding system 24 further comprises a pumping device (not shown) connected to the hollow tube 32 and suitable for generating and maintaining a standard vacuum (of the order of $10^{-7}$ Pa) inside the hollow tube 32.

Such a forwarding system, for which the inside of the tube is maintained in vacuo allows free propagation of the electromagnetic beam. This gives the possibility of minimizing the influence of passing through a material medium (dispersion, self-phase modulation) on the characteristics of electromagnetic pulses and therefore of minimizing their time extension.

Such a forwarding system including insulating ceramics, transparent to wavelengths of the electromagnetic wave emitted by the electromagnetic wave source 22 allows the ultra fast electromagnetic beam to pass from the outside of the chamber 12 to the inside of the chamber 12 in an ultra high vacuum (UHV) area while maintaining the electric insulation between the tip 14 and the extracting anode 16 but also between the floating area at −HV and the grounded areas.

The entry window 36 is adapted for transmitting the electromagnetic wave forwarded through the hollow tube 32 to the tip 14 in a UHV environment, notably from the outside to the inside of the chamber 12. It is in a material transparent to wavelengths of the electromagnetic wave emitted by the electromagnetic wave source 22. Preferably, it is in ceramic and notably in ceramic based on alumina in order to insulate the extracting voltage maintained between the tip 14 and the extracting anode 16.

Such an entry window layout 36 at the downstream end of the hollow tube 32 allows transfer of the electromagnetic beam of the area maintained in a standard vacuum ($10^{-7}$ Pa) to the ultra-high vacuum area ($10^{-9}$ Pa) required for proper operation of the field emission source.

Such an embodiment of the forwarding system 24 allows free propagation in vacuo of an electromagnetic wave from the outside of the chamber to the floating area with a high acceleration voltage.

A simpler alternative of a forwarding system may be contemplated for applications such as scanning electron microscopy, lithography . . . . According to this alternative, the forwarding system is without any hollow tube and includes a single window in transparent ceramic identical with the entry window 36 of the embodiment described hereinbefore.

Figure 3:
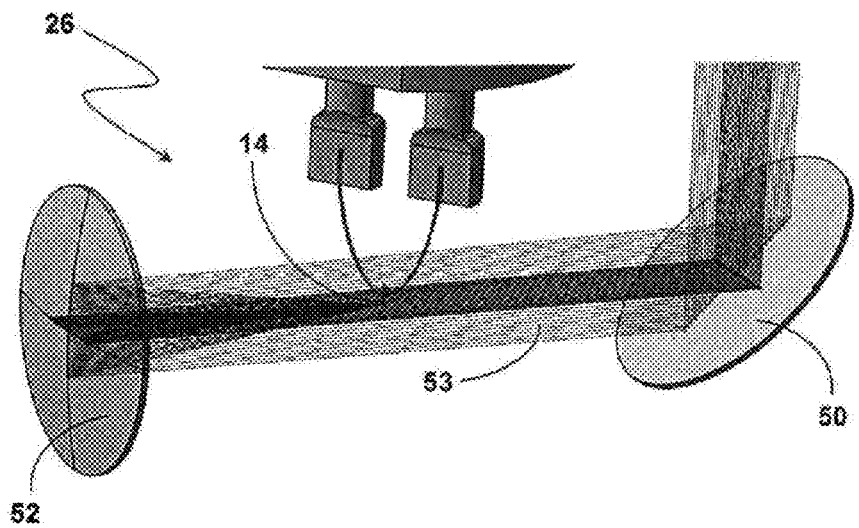
FIG. 3 is a perspective block diagram of an embodiment of a system for focusing the electromagnetic wave of the electron emission device of FIG. 1.
Figure 4:
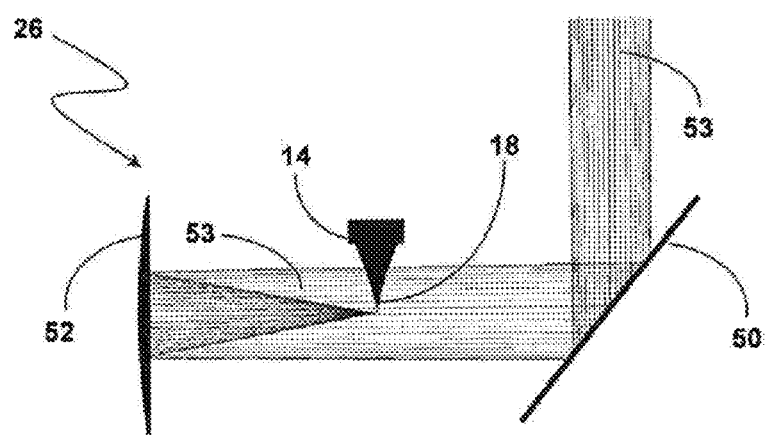
FIG. 4 is a sectional block diagram of the focusing system of FIG. 3, when it is operating.

Considering FIGS. 3 and 4, the system 26 for focusing the electromagnetic wave comprises a plane mirror 50 and a parabolic or spherical mirror 52 positioned on either side of the tip 14. The parabolic or spherical mirror 52 is laid out at a distance from the end 18 of the tip 14 substantially equal to its focal length thereby allowing adjustment of the size of the focal spot and therefore of the available power density for triggering electron emission.

Each mirror 50, 52 is connected to the same dielectric potential (−HV) as the tip 14. This notably gives the possibility of avoiding disruptive discharges and problems related to the vacuum.

Further, each mirror is mechanically coupled with the tip 14, i.e. attached to a support secured to the tip 14, giving the possibility of preserving the alignment adjusted beforehand, of the mirrors 50, 52 relatively to the tip 14 during the alignment of the tip 14 relatively to the center of the extracting anode 16.

Further, each mirror 50, 52 has a reflective surface treated with low degassing materials and having a maximum reflection coefficient at the wavelength of the electromagnetic beam emitted by the electromagnetic wave source 22.

When operating, the electromagnetic beam, noted as 53, forwarded by the forwarding system 24 is reflected by the plane mirror 50 towards the parabolic or spherical mirror 52 which, in turn, reflects it towards the end of the tip and focuses it on the end of the tip 14.

Of course, other focusing systems including reflective optics may also be used, for example of the Cassegrain type.

Figure 5:
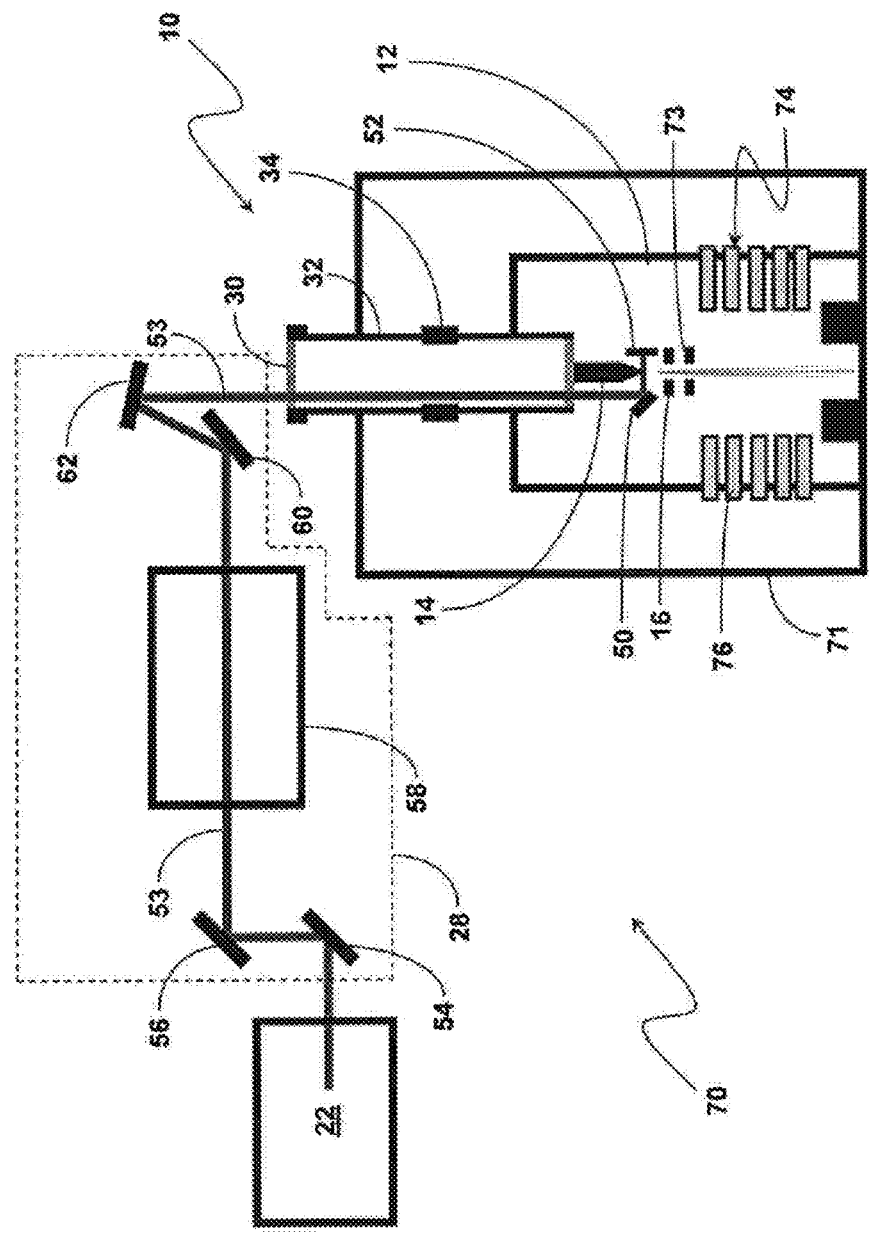
FIG. 5 illustrates a block diagram of an electron microscope source including an electron emission device according to the invention.

FIG. 5 illustrates an electron microscope source 70 including an electron emission device 10 according to the invention.

Considering FIG. 5, the alignment system 28 comprises two scanning mirrors 54, 56, an optical system 58, for example a telescopic or telecentric system, and to plane mirrors 60, 62, each laid out outside the chamber.

The optical system 58, for example a telescopic or telecentric system, is laid out between the assembly formed by the two scanning mirrors 54, 56 and the assembly formed by the two plane mirrors 60, 62.

The alignment system 28 is suitable for achieving scanning with the focused electromagnetic wave over at least 0.5 mm in each of the three dimensions around the tip.

For this purpose, the plane mirrors 60, 62 are adapted for coarsely aligning the electromagnetic beam while the scanning mirrors 54, 56 are adapted for accurately adjusting the alignment of the electromagnetic beam.

The lenses of the optical system 58, for example a telescopic or telecentric system, as well as the plane mirrors 60, 62 are adjustable in position relatively to each other by means of accurate mechanical alignment supports.

Further, one of the lenses of the optical system 58, for example a telescopic or telecentric system, is placed her on a translation stage. The scanning mirrors 54, 56 are laid down so as to displace the spot of the electromagnetic beam focused on the tip in a plane perpendicular to the electromagnetic beam (defined by the first and second directions perpendicular to each other) and the lens placed on a translation stage is laid out for displacing the spot along a third direction perpendicular to the first two.

With such an alignment system 28, it is thus possible to adjust the position and orientation of the different optical components 54, 56, 58, 60, 62, 50, 52 placed on the optical path of the electromagnetic beam in order to focus the electromagnetic beam on the end of the tip on the one hand and to be able to perform a three-dimensional scan of the beam from the outside of the chamber including the tip.

Further, this adjustment in position of the beam focused on the end of the tip is achieved while allowing the electron emission device to be operated (UHV, high acceleration voltage, extraction voltage). Such an alignment system 28 thus provides flexibility in the optimization of the emission conditions for electrons.

Such an embodiment of an electron emission device thus gives the possibility of subordinating the electron emission current to the position of the focal spot, i.e. to the position of the different optical elements of the alignment system 28 thereby allowing maximization of the yield of the emission.

Further, the focusing system 26 may include a system (not shown) for adjusting the orientation and position of each mirror 50, 52. For example, the adjustment system is a mechanical centering system or piezo-tubes operating according to a translational movement of the stick-slip type. In this case, the adjustment system has to be at the same floating potential of the high acceleration voltage when beginning to operate the electron emission device.

When operating, the electromagnetic wave source 22 emits an electromagnetic wave which propagates outside the chamber 12 through the alignment system 28 on the one hand and through the forwarding system 24 on the other hand. By means of the forwarding system, the electromagnetic wave passes from the outside to the inside of the chamber 12 by successively penetrating into a standard vacuum area in the hollow tube 32 to an ultra vacuum area in proximity to the tip 14.

Next, the electromagnetic beam is focused by the focusing system on the end of the tip forming a cold cathode. Further the polarization of the electromagnetic beam is parallel to the electron emission direction, i.e. to the tip.

An intense electric field is applied on the apex of the cathode 14 placed at an optimized distance from the extracting anode 16. The greater the bias voltage of the anode 16, called the extraction voltage, the more intense this field will be. Also, the finer the apex of the cathode 14, the more intense is this electric field. When the latter is sufficient, the electrons are extracted from the metal tip 14 to the outside by a tunnel effect, called a field effect in this specific case.

According to the invention, the extraction of the electrons is triggered by the electromagnetic beam focused on the apex 18 of the cathode 14. As the emission of electrons by a field effect is quasi-instantaneous, with the invention, it is possible to obtain electron pulses with duration comparable or even better than that of the electromagnetic pulse used for the triggering.

Indeed, the extraction of the electrons is promoted by electromagnetic field focused on the tip and having a polarization parallel to the electron emission direction. Thus, field emission is accomplished by field emission assisted by the absorption of one or more photons or by optical field emission depending on the power density of the electromagnetic wave at the apex 18 of the tip 14 and depending on the type of material making up the tip 14.

The emission of electrons is triggered by the electromagnetic field focused on the apex while keeping of the exceptional brightness properties of a standard cold field emission cathode, because of the small electron emission area.

Thus, the electron emission device according to the invention delivers ultra short pulses by field emission assisted by an ultra fast electromagnetic wave.

The electron emission device above is adapted to the application of an electron emission method and notably of an electron emission method according to the invention as described hereafter.

A method for emitting electrons according to the invention includes a stage for providing an electron emission device according to the invention as described earlier.

Further, the electron emission method comprises a step for emitting an electromagnetic wave outside the chamber by the electromagnetic wave source of the electron emission device. The polarization of the emitted electromagnetic wave is adjusted from the outside of the chamber 12, in order to control its orientation relatively to the tip.

And then, the emitted electromagnetic wave propagates from the outside to the inside of the chamber as far as the vicinity of the tip.

The electromagnetic wave is then focused inside the chamber on the tip.

Further, the method includes a step for aligning the electromagnetic wave focused on the tip, the alignment step being achieved from the outside of the chamber.

This alignment step comprises a preliminary step for adjusting the focusing system installed around the cathode without applying any high-voltage, for example by means of a mechanical centering system or of piezotubes operating in a «stick-slip» mode in order not to leave them biased upon raising the voltage of the accelerator.

Once coarse centering of the plane mirrors 50 and of the parabolic or spherical mirrors 52 located near the tip has been carried out, the tip is set into place in the chamber.

Further, the alignment step includes a step for coarsely aligning the electronic beam by means of the two plane mirrors 60, 62 followed by a step for accurately adjusting the position of the electromagnetic beam focused on the tip of the cathode achieved from the outside of the chamber 12 by the combined use of the optical system 58, for example a telescopic or telecentric system, and of the scanning mirrors 54, 56. Further, an alignment system as described earlier may allow the alignment step to be automated by subordinating the scanning of the electromagnetic beam to the intensity of the electron, and emitted by the cathode in order to maximize the yield of the emission.

Considering FIG. 5, the electron microscope source 70 further includes another chamber 71.

The chamber 12 under UHV and under high-voltage is laid out inside this other chamber 71, subsequently called an external chamber 71.

The external chamber 71 is adapted so as to electrically insulate the chamber 12 under UHV and under high-voltage from the outside of the other chamber 71. For this purpose, for example, the external chamber 71 is filled with a pressurized insulating gas notably SF6.

Thus, the elements of the electron emission device 10 laid out outside the external chamber 71, the potential of which is grounded, are electrically insulated from the region around the tip 14, the average potential of which is floating at the high negative acceleration voltage (−HV).

Further, the forwarding system 24 includes a flexible connection 34 between the hollow tube 32 and the tip 14 securely attached to the entry window 36.

Considering FIG. 2, the flexible connection 34 includes bellows, notably bellows formed with wafers welded together, adapted so as to allow free movement of the cathode 14 relatively to an assembly formed by the external chamber 71 and the hollow tube 32.

Further, the flexible connection 34 is laid out between the hollow tube 32 and the entry window 36.

Such a layout of a forwarding system 24 and of an external chamber 71 allows the electromagnetic beam to cross the area containing the pressurized insulating gas without modifying the properties of the beam and while allowing free movement of the tip 14 a relatively to the external chamber 71.

According to another aspect, the invention relates to any system comprising at least one electron emission device 10 as described hereinbefore.

In particular, the system is a transmission or scanning electron microscope, an ultra fast electron diffraction device, or an electron lithography system.

The case when the system is a transmission electron microscope source is described with reference to FIG. 5.

In the case when the system is an electron microscope, the latter includes a source of electrons 70 as illustrated in FIG. 5, a column and detectors such as a camera for example.

In a known way, the column includes electronic optical components notably suitable for forming an image.

Notably, the column includes condenser lenses, an objective lens, the object to be studied, intermediate lenses and projecting lenses.

The transmission electron microscope source 70 includes, considering FIG. 5, a device for focusing an electron beam emitted by the electron emission device 10. The focusing device is laid out inside the chamber 12 downstream from the extracting anode 16. It includes an anode 73 adapted for focusing electrons and currently called a "gun-lens".

Further, the transmission electron microscope source 70 comprises means 74 for accelerating electrons emitted by the electron emission device 10 laid out inside the external chamber 71 and downstream from the focusing device. The term of downstream is meant here, relatively to the direction of propagation of the electrons extracted from the tip 14.

The means 74 for accelerating the electrons are adapted for generating an acceleration voltage comprised between a few kV and a few MV. They include a plurality of biased anodes 76 is separated by insulating ceramics. The acceleration means 74 are laid out inside the column 72 after the so-called "gun-lens" anode in the direction of propagation of the electrons.

When operating, the electron emission device 10 emits electrons for example according to the method described earlier.

Next, the emitted electrons are focused with a second anode, called a gun-lens and then accelerated by a succession of biased anodes are separated by insulating ceramics. The acceleration voltage is generally of the order of 100 kV.

The electrons are accelerated in order to decrease their wavelength and thereby increase the resolution of the associated optical system, here a transmission electron microscope.

The electron emission device according to the invention is based on the coupling of an electromagnetic wave source with a high-voltage cold field emission electron source of a system such as an electron microscope.

First, the electron emission device according to the invention gives the possibility of delivering ultra short field effect pulses assisted by an ultra fast electromagnetic wave source, a femtosecond laser source in the embodiment described here.

The electron emission device as well as the electron emission method according to the invention may thus be used for emitting electrons in a way controlled by the electromagnetic wave source. The electromagnetic wave source gives the possibility of controlling the instant of emission of the electrons and/or the number of emitted electrons.

Such an emission device of electrons accelerated with a high-voltage delivering ultra short electronic pulses thus allows studies by electron microscopy and time-resolved electron interferometry with a time resolution below one picosecond. Indeed, coherent transmission electron microscopy techniques may be directly transposed by such a field effect electron emission device according to the invention, for studying dynamic phenomena down to sub-picosecond time resolutions.

This source may further be used for generating diffraction patterns out of a transmission electron microscope (TEM). This type of technique is well known and is highly used for studying structural time-dependent changes of nano-objects subject to ultra fast dynamics without the drawbacks from the technical complexity of a TEM. Further, the use of a field effect electron emission device according to the invention gives the possibility of combining these diffraction techniques with interferometry techniques and thus achieving coherent electron diffraction.

Of course, the present invention is not limited to the described and illustrated examples and embodiment, but it is capable of many alternatives accessible to one skilled in the art.

The invention claimed is:

1. A field effect electron emission device comprising:
a vacuum chamber including a tip comprising one end and forming a cold cathode, an extracting anode, components adapted for generating a potential difference between the tip and the anode;
an electromagnetic wave source outside the chamber;
a system for forwarding the electromagnetic wave emitted by the electromagnetic wave source from the outside to the inside of the chamber as far as the vicinity of the tip;
a system for focusing the electromagnetic wave, laid out inside the chamber; and
a system for aligning the electromagnetic wave, laid out outside the chamber and adapted so as to allow alignment of the electromagnetic wave focused by the focusing system on the end of the tip.

2. The electron emission device according to claim 1, wherein the assembly formed by the electromagnetic wave source, the forwarding system, the focusing system and the alignment system is adapted for propagating the electromagnetic wave so that it arrives at the end of the tip with an angle different from 0° or 180° relatively to the tip axis.

3. The electron emission device according to claim 1, wherein the assembly formed by the electromagnetic wave source, the forwarding system, the focusing system and the alignment system is adapted for propagating the electromagnetic wave so that it arrives at the end of the tip substantially perpendicularly to the axis of the tip.

4. The electron emission device according to claim 1, wherein the forwarding system comprises an entry window adapted for transmitting the electromagnetic wave from the outside to the inside of the chamber and a hollow tube adapted for propagating the electromagnetic wave in the chamber as far as the vicinity of the end of the tip, the tube being in a material having a dielectric coefficient substantially comprised between 10 and 40 kV/mm.

5. The electron emission device according to claim 4, wherein the entry window is in ceramic transparent to the wavelength of the electromagnetic wave emitted by the source.

6. The electron emission device according to claim 1, wherein the alignment system comprises at least two scanning mirrors and an optical system.

7. The electron emission device according to claim 1, wherein the tip is selected from the list consisting in:
   a tungsten tip oriented along different crystallographic axes;
   a cone-shaped tip in a material including carbon;
   a gold tip.

8. The electron emission device according to claim 1, wherein the electromagnetic wave source is a laser.

9. A system comprising at least one electron emission device according to claim 1, the system being selected from the list consisting in:
   a transmission or scanning electron microscope,
   an ultra fast electron diffraction device,
   an electron lithography system.

10. An electron microscope including an electron emission device according to claim 1, a column including electronic optical components and means for accelerating the electrons emitted by the electron emission device.

11. The electron microscope according to claim 10, wherein the means for accelerating the electrons are adapted for generating an acceleration voltage of about 100 kV.

12. A method for emitting electrons with a field effect comprising the following steps:
   providing an electron emission device according to claim 1;
   emitting an electromagnetic wave outside the chamber by the electromagnetic wave source of the electron emission device;
   propagating the emitted electromagnetic wave towards the inside of the chamber as far as the vicinity of the tip;
   focusing the electromagnetic wave inside the chamber on the tip; and
   aligning the electromagnetic wave focused on the tip, the alignment step being carried out from the outside of the chamber.

13. A field effect electron emission device comprising:
   a vacuum chamber including a tip comprising one end and forming a cold cathode, an extracting anode, components adapted for generating a potential difference between the tip and the anode;
   an electromagnetic wave source outside the chamber;
   a system for forwarding the electromagnetic wave emitted by the electromagnetic wave source from the outside to the inside of the chamber as far as the vicinity of the tip;
   a system for focusing the electromagnetic wave, laid out inside the chamber; and
   a system for aligning the electromagnetic wave, laid out outside the chamber and adapted so as to allow alignment of the electromagnetic wave focused by the focusing system on the end of the tip,
   wherein the system for focusing the electromagnetic wave comprises a plane mirror and a parabolic or spherical mirror positioned on either side of the tip, each mirror being connected to the same electric potential as the tip.

14. A field effect electron emission device comprising:
   a vacuum chamber including a tip comprising one end and forming a cold cathode, an extracting anode, components adapted for generating a potential difference between the tip and the anode;
   an electromagnetic wave source outside the chamber;
   a system for forwarding the electromagnetic wave emitted by the electromagnetic wave source from the outside to the inside of the chamber as far as the vicinity of the tip;
   a system for focusing the electromagnetic wave, laid out inside the chamber; and
   a system for aligning the electromagnetic wave, laid out outside the chamber and adapted so as to allow alignment of the electromagnetic wave focused by the focusing system on the end of the tip,
   wherein the alignment system is adapted for achieving a scan of the focused electromagnetic wave by at least 0.5 mm in each of the three dimensions around the tip.

* * * * *